United States Patent [19]

Ito et al.

[11] Patent Number: 5,393,641
[45] Date of Patent: Feb. 28, 1995

[54] RADIATION-SENSITIVE RESIN COMPOSITION

[75] Inventors: Toshio Ito; Miwa Sakata, both of Tokyo, Japan

[73] Assignee: Oki Electric Industry Co., Ltd., Tokyo, Japan

[21] Appl. No.: 254,676

[22] Filed: Jun. 6, 1994

Related U.S. Application Data

[63] Continuation of Ser. No. 12,425, Feb. 2, 1993, abandoned.

[30] Foreign Application Priority Data

Feb. 3, 1992 [JP] Japan .................. 4-017588

[51] Int. Cl.$^6$ ............................................. G03F 7/038
[52] U.S. Cl. .................................. 430/270; 430/296; 430/325; 430/914; 430/921; 430/925; 430/942; 522/31; 522/59; 522/148
[58] Field of Search ............... 430/270, 325, 914, 921, 430/925, 296, 942; 522/31, 59, 148

[56] References Cited

U.S. PATENT DOCUMENTS

| | | | |
|---|---|---|---|
| 5,120,629 | 6/1992 | Bauer et al. | 430/270 |
| 5,135,838 | 8/1992 | Houlihan et al. | 430/270 |

FOREIGN PATENT DOCUMENTS 55-127023 10/1980 Japan .
60-186570 9/1985 Japan ...................... 522/31
60-49647 11/1985 Japan .
61-20030 1/1986 Japan .
61-144639 7/1986 Japan .
61-198151 9/1986 Japan .
4-159553 6/1992 Japan ...................... 430/270
4-212160 8/1992 Japan ...................... 430/270

OTHER PUBLICATIONS

PTO-English-Translation of Japanese Patent 60-186570 Pub Data Sep. 24, 1985.
"Complex Triarylsulfonium Salt Photoinitiators. I. The Identification Characterization, and Synthesis of a New Class . . . " J. V. Crivello et al., *Journal of Polymer Sci.*: Polymer Chemistry Edition, vol. 18, 2677-2695 (1980).
"Photoinitiation of Cationic Polymerization. II. Laser Flash Photolysis of Diphenyliodonium Salts", S. Peter Pappas, et al., *Journal of Polymer Sci.*: Polymer Chemistry Ed., vol. 22 69-76 (1984).

*Primary Examiner*—Janis L. Dote
*Attorney, Agent, or Firm*—Wenderoth, Lind & Ponack

[57] ABSTRACT

A novel radiation-sensitive resin composition having high sensitivity and high $O_2$-RIE resistance is otained by blending 0.5 g of poly(di-t-butoxysiloxane), 50 mg of triphenylsulfonium trifluoromethanesulfonate as acid-producing agent, and 4 ml of 2-methoxyethyl acetate as solvent.

6 Claims, No Drawings

RADIATION-SENSITIVE RESIN COMPOSITION

This application is a continuation of now abandoned application Ser. No. 08/012,425, filed Feb. 2, 1993, now abandoned.

BACKGROUND OF THE INVENTION

This invention relates to a novel radiation-sensitive resin composition which can be employed as a material for forming a resist used in the manufacture of semiconductor devices, and which is sensitive to light, electron beams, X rays or ion beams.

Due to the increasing packing density of LSI devices, techniques are coming to be required which can process components at the sub-micron level. One such technique used in the manufacture of LSI is dry etching, a procedure which permits high precision and fine detail.

The meaning of dry etching in this context is a procedure whereby a substrate (a semiconductor substrate or any layer thereon) to be processed is covered by a resist, the resist is patterned by light or an electron beam, and using the pattern obtained as a mask, the exposed parts of the substrate not covered by the mask are etched by a reactive gas plasma. Resists used in dry etching therefore consist of materials which are able to resolve patterns of sub-micron order, and which have sufficient resistance to reactive gas plasmas.

As LSI devices become more highly integrated, the steps formed on the substrates are becoming higher, and the patterns formed on the substrate are required to have high aspect ratios. In order for the steps to be planarized, and in order for the resist layer to serve as a mask right up to the end of processing, the resist layer is tending to be made thicker. This however means that when the resist is exposed to light, any restriction in the depth of focus of the exposing optical system will have more adverse effect, while if the resist is exposed to an electron beam, electron scattering has more serious consequences. This leads to a decrease in resolution of the resist, and as a result, it is becoming increasingly difficult to process a substrate with a single resist layer.

A new resist process that is now being studied is the double layer resist method. This makes use of a thick polymer layer (referred to hereinafter as a lower layer normally consisting of a polyimide or thermally cured photoresist) for planarizing the steps in the substrate, and a thin photoresist layer or electron beam resist layer (referred to hereinafter as an upper layer) which is formed on the polymer layer and has resistance to $O_2$-RIE (reactive ion etching). More specifically, the upper layer makes it possible to obtain a high resolution pattern which is used as a mask to pattern the lower layer by $O_2$-RIE, and the lower layer pattern thus obtained is then used as a mask for dry etching when the substrate is processed.

The upper layer resist must have a greater resistance to $O_2$-RIE than the lower layer resist, and it therefore often consists of a silicon type photosensitive resin composition. An example of such a composition is a silicone resin used as a binder with which a photo crosslinking agent or a photopolymerization initiator is blended, and this may be used as a negative resist.

The following are conventional examples of such a photosensitive resin composition.

Japanese Patent Kokai Publication S61-20030 discloses a composition comprising a resin containing double bonds such as poly(acryloyloxymethylphenylethylsilsesquioxane), and a diazide. This composition could be used as a highly sensitive resist for patterning by UV (ultra-violet) light in a nitrogen atmosphere.

Japanese Patent Kokoku Publication No. S60-49647 discloses a photosensitive resin composition using a polysilane as a photopolymerization initiator. More specifically, it is disclosed that a composition consisting of a poly(organosiloxane) having double bonds and dodecamethylcyclohexasilane has good properties as a UV photocuring resin.

Japanese Patent Kokai Publication S55-127023 discloses a photosensitive resin composition which uses an organic peroxide as a photopolymerization initiator. More specifically, it is disclosed that a composition using a polyorganosiloxane containing double bonds and a suitable organic peroxide (for example a peroxyester or the like), gives a uniform cured film when irradiated by UV light.

The following completely different types of materials have been proposed for the photosensitive resin composition used as the upper layer.

Japanese Patent Kokai Publication S61-144639 discloses a composition wherein polyphenylsilsesquioxane and cis(1,3,5,7-tetrahydroxy)-1,3,5,7-tetraphenylcyclotetrasiloxane are added in small amounts to a common positive photoresist such as OFPR-800 (Tokyo Ooka Kogyo Inc.). This composition can be used as a positive resist which can be developed in alkali.

Other materials apart from polysiloxanes are being studied in view of their possible application as binders. Japanese Patent Kokai Publication S61-198151, for example, discloses a photosensitive resin composition sensitive to visible light which uses a novolak resin containing trialkylsilyl groups together with a diazonaphthoquinone photosensitizer.

If the aforesaid conventional photosensitive compositions were used as upper layer resists in a two layer resist process, however, the following problems arose:

(a) In general, photocuring reactions which proceed via organic radical intermediates are blocked by oxygen. In the case of a photosensitive resin composition which is photocured by this mechanism, therefore (for example, the photosensitive resin composition disclosed in Japanese Patent Kokai Publication S61-20030 wherein a diazide is used as photopolymerization initiator), high sensitivity could not be achieved unless the exposure were performed in a nitrogen atmosphere. The same problem arises in the case of the photosensitive resin composition disclosed in Japanese Patent Kokai Publication S55-127023 wherein an organic peroxide is used as photopolymerization initiator. When an organic peroxide was used in the composition, the properties of the cured film improved, however a considerable time was required for curing.

(b) Regarding the photosensitive resin composition disclosed in Japanese Patent Kokoku Publication No. S60-49647 wherein a polysilane is used as photopolymerization initiator, it is the inventor's experience that although a diazide is not used, sensitivity still deteriorates if oxygen is present.

Due to the aforesaid problems (a) and (b), a high throughput cannot be obtained if the exposure is performed in a nitrogen atmosphere. Moreover, performing the exposure in a nitrogen atmosphere requires various equipment to supply the nitrogen in the vicinity of the wafer.

(c) Regarding the photosensitive resin composition disclosed in Japanese Patent Kokai Publication S61-

144639 wherein a silicon compound is added to a common photoresist, or the photosensitive resin composition disclosed in Japanese Patent Kokai Publication S61-198151 wherein a substance other than a polysiloxane is used as a binder, the silicon content of the silicon compound added and the silicon content of the binder used are too low so that sufficient $O_2$-RIE resistance is not obtained.

SUMMARY OF THE INVENTION

This invention was conceived to overcome the aforesaid problems, and it therefore aims to provide a novel radiation-sensitive composition which has high sensitivity and high $O_2$-RIE resistance.

In order to achieve this objective, the radiation-sensitive resin compound of this invention comprises a linear polysiloxane having a C—O—Si bond in each monomer unit, and an acid-producing agent which decomposes to produce acid due to the action of radiation.

It is conjectured that in this type of resin composition, acid is produced by the acid-producing agent in those parts of the composition exposed to radiation, and the acid then cleaves the C—O—Si bond of the polysiloxane in the composition so as to produce silanol. In other words, it is conjectured that as shown in Equation (2) below (which shows an example where methyl is bonded to oxygen), the C—O bond is cleaved in the presence of acid or water, and silanol is thereby produced. Silanol easily undergoes condensation. The net result is therefore that in those parts of the composition exposed to radiation, the silanol is converted to siloxane as in Equation (3), the molecular weight increases, and the product gelates. As these gelated parts are insoluble in, for example, developer solution, this radiation-sensitive resin composition may thus be used as a negative resist. Further, as the siloxane produced has almost identical properties to $SiO_2$ and as it has a high silicon content, it confers high $O_2$-RIE resistance on the radiation-sensitive resin composition. Moreover, as the aforesaid gelation of the polysiloxane is caused by only a small amount of acid from the acid-producing agent, the amount of exposure of the radiation-sensitive resin composition need be only enough to produce the desired amount of acid, and the composition therefore has high sensitivity.

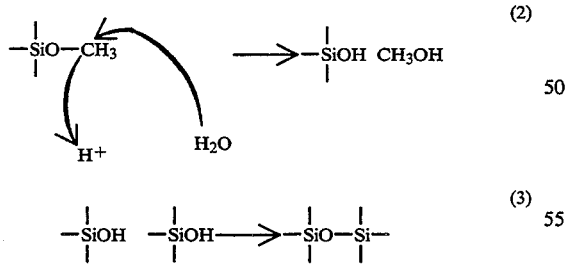

Still further, as the polysiloxane used in this invention has a C—O—Si bond in every monomer unit, a large number of the aforesaid condensation reactions can be initiated in the polysiloxane chain, and 3-dimensional crosslinking takes place. As a high degree of crosslinking can be achieved in the irradiated parts, the molecular weight of the polysiloxane itself can be low.

A suitable range for the molecular weight of the polysiloxane may be chosen depending on the application of the radiation-sensitive resin composition. If the composition is to be used as, for example, a resist, it must be able to form a solid film, it must be soluble in a solvent so that a resist coating solution may be prepared, and it must give the desired resolution. From these considerations, its molecular weight should be in the range 500–100,000, but more preferably 1,000–50,000.

Various polysiloxanes may be used provided the aforesaid conditions are satisfied, for example the poly(dialkoxysiloxane) or poly(diaryloxysiloxane) represented by Equation (1) below. In Equation (1), $R^1$, $R^2$ are primary alkyl, secondary alkyl, tertiary alkyl or aryl groups, and they may be identical or different. $R^3$ is hydrogen or trimethylsilyl and n represents the degree of polymerization. As this type of polysiloxane has C—O bonds on both sides of the main chain, the effect of the acid produced by the acid-producing agent is more easily propagated and a high degree of crosslinking can be achieved.

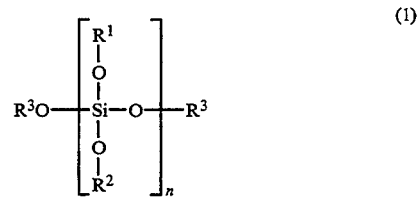

Further, a ladder-type polysiloxane may also be used in conjunction if desired.

For the acid-producing agent which is another essential component of this invention, various conventional substances may be used. Hydrogen halides are however not very suitable as their catalytic activity is weak. For example, the sulfonium salts represented by the Formulae (I) and (II) below, the iodonium salts represented by the formulae (III) and (IV) below, the aromatic compounds containing at least one trichloromethyl group represented by the Formulae (V) and (VI) below, and the p-toluenesulfonates represented by the formulae (VII) below, are all suitable.

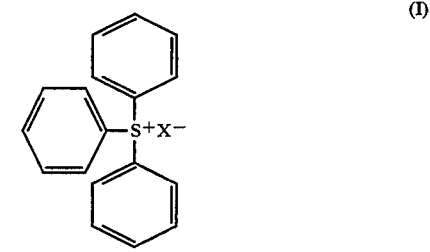

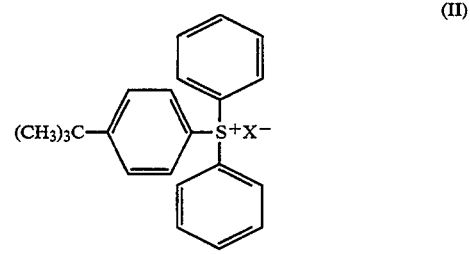

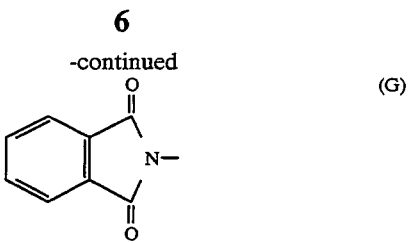

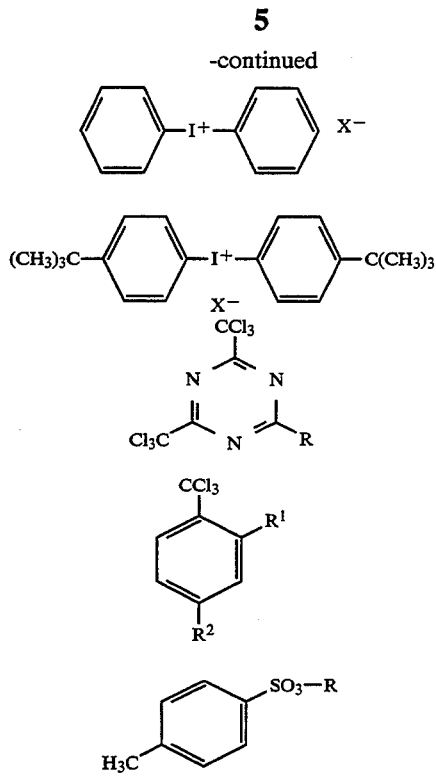

In the formulae (I)–(IV), X⁻ may for example be BF₄⁻, AsF₆⁻, SbF₈⁻, ClO₄⁻ or CF₃SO₃⁻. R in Formula (V) may for example be CCl₃, or any of the groups represented by (A), (B), (C), (D) or (E) below. R¹ in Formula (VI) may for example be Cl or II, and R² may for example be Cl or CC₃. R in formula (VII) may for example be the groups represented by (F) or (G) below.

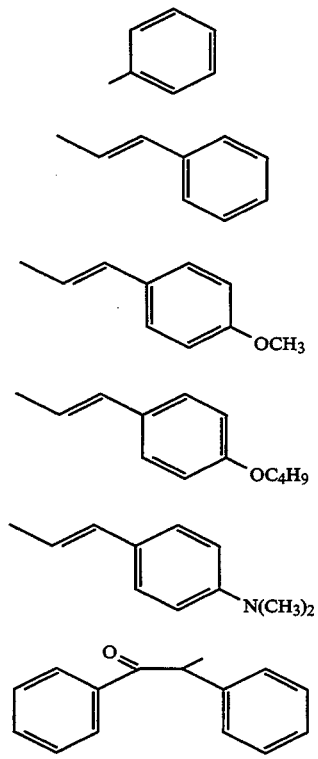

(III)

(IV)

(G)

Apart from several exceptions, most of the aforesaid acid-producing agents are available commercially. The aforesaid triarylsulfonium salts have been studied by J. V. Crivello et al. (e.g. J. Polymer Sci., polymer Chem. Ed., 18, 2677 (1980)), and may be synthesized by the method disclosed therein. Further, the diaryliodonium salts have been studied by S. Peter Pappas et al. (e.g. Polymer Sci., Polymer Chem. Ed., 2269 (1984)), and may be synthesized by the method disclosed therein. These acid-producing agents should preferably be added in a proportion of 0.01–50 weight %, and more preferably in a proportion of 0.05–30 weight %, with respect to the weight of polysiloxane used. If the blending proportion lies outside this range, the radiation sensitivity of the resin composition decreases, and the film coating becomes fragile.

If the resin composition is coated onto a substrate by spin coating in order to form a film on the substrate, a solvent is required to prepare the coating solution. This solvent may for example be 2-methoxyethyl acetate, chlorobenzene, xylene, dioxane, methylisobutyl ketone (MIBK) or isoamyl acetate.

Further, if the sample is heated after irradiating the resin film, it is easier to render the irradiated parts of the film insoluble in the developer solution.

DETAILED DESCRIPTION OF THE PREFERRED EMBODIMENTS

Embodiments of the invention will now be described. It should be understood however that in the following description, the materials, quantities, process times, temperatures, film thicknesses and other numerical conditions are given only as suitable examples within the scope of the invention, and are not to be construed as limiting the invention in any way.

1 PREPARATION OF RADIATION-SENSITIVE RESIN COMPOSITION

In the following procedure, the polysiloxane used in the radiation-sensitive resin composition is first synthesized, and a resist solution is then prepared from it.

1-1 Synthesis of Polysiloxane

In this example, in the linear polysiloxane represented by the aforesaid formula (1) having a C—O—Si bond in each monomer unit, R¹ and R² are both t-butyl, and R³ is trimethylsilyl. This poly(di-t-butoxysiloxane) is synthesized in the following manner.

A 300 ml four-necked flask equipped with a mechanical stirrer, Dimroth condenser, thermometer and rubber septum was prepared. After removing the rubber septum, 5.8 g (20 mmol) of diacetoxy-di-t-butoxysilane (t-BuO)₂(CH₃CO₂)₂Si and 100 ml of MIBK (0.2 mol/l base concentration) were introduced. The flask was cooled by water (at approx. 25° C.), then 0.28 ml (2 mmol) of triethylamine and 3.6 ml (200 mmol) of water (H₂O) were added.

After stirring the contents of the flask at 24° C. for 1 hour, they were raised to a temperature of 80° C. for 30 minutes on the oil bath, and the reaction was allowed to continue for 12 hours. After cooling to room temperature, the reaction solution was transferred to a conical flask containing MgSO$_4$ to be dried.

The aforesaid solution which had been dried directly over MgSO$_4$ was then transferred to a three-neck flask equipped with a thermometer, Dimroth condenser, dropping funnel, rubber septum and magnetic stirrer, and the flask was cooled on an ice bath. 5.0 ml (40 mmol) of trimethylchlorosilane was then introduced by a syringe through the rubber septum, and 5.6 ml (40 mmol) of Et$_3$N was added from the dropping funnel.

After stirring the contents of the flask overnight, its temperature was raised to 60° C. on the oil bath, and stirring continued for 1 hour. After cooling, the contents were filtered. After distilling off MIBK until the total volume was approximately 30 ml, toluene was added to the resultant solution. The solvents were again distilled off, and the distillation was stopped when the total volume had reached approx. 20 ml, and the contents were poured into a large volume of methanol. This caused formation of a white precipitate. After filtering the precipitate and drying it under vacuum at room temperature overnight, 2.1 g of product was obtained.

The NMR spectrum of this product in heavy chloroform was examined. A peak due to t-butyl was observed at $\delta$1.3, and a peak due to trimethylsilyl at $\delta$0.09. Analysis of the IR (infrared) spectrum showed a strong absorption due to siloxane at a wave number of 1150 cm$^{-1}$, and an absorption due to t-butyl at wave number 1370 cm$^{-1}$. Further molecular weight measurements by GPC (gel permeation chromatography) gave a weight average molecular weight M$_w$ of 20,000, and a relative dispersion M$_w$/M$_n$ of 2.5.

1-2 Preparation of Resist Solution 0.5 g of the poly(di-t-butoxysilane) synthesized as described hereintofore was mixed with 50 mg of triphenylsulfonium trifluoromethanesulfonate (wherein X$^-$ in the aforesaid formula (I) is CF$_3$SO$_3^-$) as acid-producing agent, and 4 ml of 2-methoxyethyl acetate as solvent. This mixture was filtered through a membrane filter with 0.2 $\mu$m diameter holes to give the resist solution.

2 EVALUATION OF RADIATION-SENSITIVE RESIN COMPOSITION

2-1 Evaluation of Composition

The sensitivity and resolution of the radiation-sensitive resin composition alone were first evaluated using the resist solution prepared as described above.

For this purpose, the resist solution was coated onto a silicon wafer under predetermined conditions. The silicon wafer was then prebaked at a temperature of 80° C. for 1 hour using a hot plate. After prebaking, the thickness of the resist film was 0.2 $\mu$m.

Next, a suitable number of test patters were drawn with different exposures using an electron beam having an acceleration voltage of 20 KV. The electron beam exposure machine was an Elionix ELS 3300.

After exposure, the sample was baked at 160° C. for 2 minutes on a hot plate. The sample was developed in methylisobutyl ketone for 30 seconds, and then rinsed in cyclohexane for 30 seconds. The remaining film thickness was measured by a film thickness gauge (in this case, a Tailor-Hobson Talystep), normalized with the initial film thickness (thickness after prebaking=0.2 $\mu$m), and then plotted against the logarithm of the amount of exposure to give a characteristic curve. The sensitivity of the resist in this example was found from this curve to be 1.6 $\mu$C/cm$^2$, and the contrast $\gamma$ was found to be 5.0. Further, examination by a scanning electron microscope (SEM) showed that a 0.3 $\mu$m line and space pattern could be resolved at an exposure of 2 $\mu$C/cm$^2$.

2-2 Evaluation Applied to Double Layer Resist Method

A photoresist was coated on a silicon wafer by spin coating and heat cured so as to form a lower layer resist of film thickness 2 $\mu$m on the wafer.

The aforesaid resist solution was then coated onto this lower layer under the sane conditions as those of Section 2-1 above, and prebaked gain so as to form a resist film of 0.2 $\mu$m thickness. Next, a test pattern was traced on the resist film by an electron beam using the same conditions as those of Section 2-1 above excepting that the amount of exposure was 2.4 $\mu$C/cm$^2$. Baking, developing and rinsing were then performed under the same conditions as those of Section 2-1 above.

The sample obtained was installed in the reaction tank of a dry etching apparatus manufactured by Anelva and known as DEM 451, the gas pressure in the tank set to 1.3 Pa, the RF power density set to 0.12 W/cm$^2$, and the sample was etched by an oxygen plasma for 40 minutes using an oxygen gas flowrate of 50 sccm (standard cubic centimeters).

After etching was complete, the sample was examined by SEM. A 0.5 $\mu$m line and space pattern having a thickness of approx. 2 $\mu$m was observed, and it was found that the side walls of the lines were effectively vertical with respect to the wafer surface.

2-3 Evaluation of Film After Exposure

Next, a resist film was formed on a silicon wafer by the same procedure as that of Section 2-1 above, and prebaking was performed. A 500 $\mu$m square pattern was traced on this film using the aforesaid apparatus, an electron beam having an acceleration voltage of 20 KV and an exposure of 2.0 $\mu$C. The exposed sample was baked at 160° C. for 5 minutes on a hot plate. The area of the 500 $\mu$m square pattern of the sample was analyzed by microscopic IR. A large absorption due to siloxane was observed at wave number 1150 cm$^{-1}$, but almost no absorptions due to organic groups were observed. This means that the parts of the resin composition in this example which were exposed to the electron beam were transformed into a material similar to SiO$_2$.

This invention has been described above by means of specific examples, but it is in no way limited to them.

For example, in the aforesaid examples, poly(di-t-butoxysiloxane) was used as the polysiloxane and triphenylsulfonium trifluoromethanesulfonate was used as the acid-producing agent, however these were given only for purposes of illustration. The same effects as those of the examples can be obtained using suitable substances for the polysiloxane other than those represented by the aforesaid formula (1), and suitable substances for the acid-producing agent other than those represented by the aforesaid formulae (I)-(VII).

Further, in the aforesaid example, the radiation-sensitive resin composition was exposed to an electron beam. The radiation used for the exposure is however not limited to electron beams, and the same effects as those of the examples may be obtained by using light, X-rays, ion beams or other radiations.

Further, in the aforesaid examples, the case has been described where the radiation-sensitive resin composition of this invention was used as a resist to form a pattern. It may however be used also as an intermediate layer in a triple layer resist method, moreover its applications are not limited to resists. Other possible applications include, for example, junction coating agents or buffer coating agents to protect semiconductor devices.

As described hereintofore, in those parts of the resin composition of this invention which are irradiated, the C—O—Si bonds of the polysiloxane in the composition are cleaved by acid produced by an acid-producing agent. This generates silanol which condenses so as to cause gelation. The irradiated parts of the resin therefore become insoluble in, for example, a developer solution, and consequently the resin composition can be used as a negative resist. Further, as the gelated parts are practically identical in nature to $SiO_2$, their silicon content is high, and the resin composition exhibits excellent resistance to $O_2$-RIE.

Further, as the aforesaid gelation occurs due to the acid produced by the acid-producing agent even if the resin composition is irradiated by very small amounts of radiation, only a small exposure is necessary, and a highly sensitive resin composition is thereby obtained.

Further, as the polysiloxane used in this invention has C—O—Si bonds in every monomer unit, many of the aforesaid condensation reactions occur on the polysiloxane chain, and three-dimensional crosslinking takes place. A high degree of crosslinking of the irradiated parts of the composition is thus obtained, and the molecular weight of the polysiloxane itself need not be high.

Still further, if the polysiloxane used is a poly(dialkoxysiloxane) or a poly(diaryloxysilane) represented by the aforesaid formula (1), the polysiloxane has C—O bonds on both sides of the main chain. The effect of the acid produced by the acid-producing agent is therefore more easily propagated and a high degree of crosslinking is obtained, thus making the invention even more useful.

What is claimed is:

1. A radiation-sensitive resin composition comprising:
   a linear polysiloxane having a C—O—Si bond in each monomer unit, wherein said polysiloxane is a poly(-dialkoxysiloxane) or a poly(diaryloxysiloxane) represented by the following formula (1):

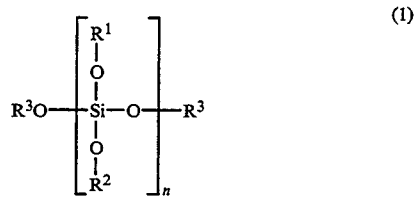

where $R^1$ and $R^2$ are primary, secondary or tertiary alkyl groups or aryl groups which are identical to or different from one another, $R^3$ is hydrogen or trimethylsilyl, and n represents degree of polymerization; and
   an acid-producing agent which decomposes to produce acid due to the action of radiation.

2. A radiation-sensitive resin composition as defined in claim 1 characterized in that said acid-producing agent is a sulfonium salt added to said polysiloxane in a proportion of 0.01-50 weight %, based on the weight of the polysiloxane.

3. A radiation-sensitive resin composition as defined in claim 1 characterized in that said acid-producing agent is an iodonium salt added to said polysiloxane in a proportion of 0.01-50 weight %, based on the weight of the polysiloxane.

4. A radiation-sensitive resin composition as defined in claim 1 characterized in that said acid-producing agent is an aromatic compound having at least one trichloromethyl group, and is added to said polysiloxane in a proportion of 0.01 to 50 weight %, based on the weight of the polysiloxane.

5. A radiation-sensitive resin composition as defined in claim 1 characterized in that said acid-producing agent is p-toluenesulfonate, and is added to said polysiloxane in a proportion of 0.01-50 weight %, based on the weight of the polysiloxane.

6. A radiation-sensitive resin composition as defined in claim 1, wherein said poly(dialkoxysiloxane) is a material obtained by polycondensation of diacetoxy-di-t-butoxysilane.

* * * * *